United States Patent [19]

Benden et al.

[11] 4,132,816

[45] Jan. 2, 1979

[54] GAS PHASE DEPOSITION OF ALUMINUM USING A COMPLEX ALUMINUM HALIDE OF AN ALKALI METAL OR AN ALKALINE EARTH METAL AS AN ACTIVATOR

[75] Inventors: Robert S. Benden, Rocky Hill; Richard S. Parzuchowski, Glastonbury, both of Conn.

[73] Assignee: United Technologies Corporation, East Hartford, Conn.

[21] Appl. No.: 661,903

[22] Filed: Feb. 25, 1976

[51] Int. Cl.$^2$ ............................................... C23C 11/00
[52] U.S. Cl. ..................................... 427/237; 427/239; 427/253
[58] Field of Search ................ 427/237, 239, 252, 253

[56] References Cited

U.S. PATENT DOCUMENTS

| | | | |
|---|---|---|---|
| 3,325,313 | 6/1967 | Galmich | 427/252 |
| 3,462,288 | 8/1969 | Schmidt et al. | 427/252 |
| 3,486,927 | 12/1969 | Gauje | 427/253 |
| 3,904,789 | 8/1975 | Speirs et al. | 427/253 |
| 3,978,251 | 8/1976 | Stetson et al. | 427/253 X |

*Primary Examiner*—Ralph S. Kendall
*Attorney, Agent, or Firm*—Steven F. Stone

[57] ABSTRACT

A gas phase aluminizing process for alloys based on Group VI B and VIII metals such as chromium, iron, cobalt and nickel is disclosed. The process is particularly useful in the coating of internal passages of complex high temperature gas turbine hardware such as blades and vanes, where it has been found that the complex aluminum halide activators used herein have a "throwing power" greater than was heretofore obtained with the conventional halide activators such as ammonium chloride in the gas phase process.

8 Claims, No Drawings

GAS PHASE DEPOSITION OF ALUMINUM USING A COMPLEX ALUMINUM HALIDE OF AN ALKALI METAL OR AN ALKALINE EARTH METAL AS AN ACTIVATOR

BACKGROUND OF THE INVENTION

The aluminizing process is well-known to the art for improving the corrosion resistance of many substrates such as alloys containing chromium, iron, nickel or cobalt, for example, as the major constituent and in particular, improving the properties of the nickel-and cobalt-based superalloys which are used in high-temperature environment, such as gas turbine blades and vanes. In a typical aluminizing process, the part to be aluminized would be embedded in a pack powder containing aluminum, either as the metal or alloyed with another metal such as cobalt, for example; a carrier, typically an ammonium or alkali metal halide, and an inert filler such as alumina. The part would be embedded in this pack and heated to 1200° F.–2200° F. to coat the external surface of the part with aluminum; the thickness of the coating depending upon the time and temperature of treatment. In this process, the halide acts as a carrier or activator to facilitate the transfer of the aluminum from the source of the aluminum to the part. Representative patents showing these types of pack cementation processes are those to Puyear et al., U.S. Pat. No. 3,079,276 dated Feb. 26, 1963, for Vapor Diffusion Coating Process; Fitzer, U.S. Pat. No. 2,886,469 dated May 12, 1959, for Method of Coating Metallic Bodies with Aluminum Utilizing Vaporous Sub-Chlorides; Zupan, U.S. Pat. No. 3,335,028 dated Aug. 8, 1967, for Complex Fluoro Salt Cementation Method for Coating Refractory Metallic Substrates; Brill-Edwards U.S. Pat. No. 3,694,255 dated Sept. 26, 1972, for Method For Coating Heat Resistant Alloys and Speirs et al. U.S. Pat. No. 3,764,373 dated Oct. 9, 1973, for Diffusion Coating of Metals.

When internal passages are required to be coated using the pack process, difficulties are encountered because the internal passages, which in many cases are quite small, must be filled with the pack powder mixture and after treatment, these internal passages must be cleared of any residual pack powder mixture. In addition, coating deposition is effected by the ratio of pack powder to surface area to be coated. Therefore, internal part geometry effects the thickness of coating deposited. Thus, when internal passages are to be coated, attempts have been made to use a gas phase deposition process in which the part would be suspended outside of the powder mixture and a gaseous, aluminum-containing material caused to flow through the part. A typical approach is, for example, described in the patent to Gauje U.S. Pat. No. 3,486,927 dated Dec. 30, 1969, for Process For Depositing A Protective Aluminum Coating on Metal Articles. It should be noted that the Gauje patent was not directed specifically to the coating of internal surfaces and when attempts were made to adapt the Gauje process to the coating of internal passages, it was not possible to obtain a usably uniform internal coating of aluminum.

According to this invention, we have found that the use of complex aluminum halides of an alkali metal or an alkaline earth metal as the activator substantially increases the "throwing power" of a gas phase deposition process for the aluminizing of internal surfaces and a usably uniform coating is obtained. Also, the effect of part internal geometry on coating thickness is greatly reduced.

It is, accordingly, an object of this invention to provide gas phase aluminizing process particularly adapted for the coating of internal passages.

This and other objects of the invention will be readily apparent from the following description.

DESCRIPTION OF THE INVENTION

According to this invention, we have found that aluminum can be caused to deposit on alloy metal substrates selected from the group of iron, chromium, nickel, and cobalt-base metals through a gas phase deposition process in which the aluminum is carried from a powder mixture to the internal surfaces of the substrate by the use of a carrier consisting of a complex aluminum halide of an alkali or alkaline earth metal. The halide portion of this complex can be any of the available halides, such as fluorine, chlorine, bromine or iodine. Further, since under the conditions of the treating process, the complex aluminum halide vapor is an equilibrium mixture of an aluminum halide and an alkali metal or alkaline earth halide, the complex aluminum halide may be substituted by a mixture of an alkali or alkaline earth metal halide and aluminum halide. Thus, for example, instead of including in the mixture the complex $Na_3AlF_6$, similar results may be obtained by mixtures of sodium fluoride and aluminum fluoride. If this approach is used, the ratio of alkali metal halide to aluminum halide is preferably in the range of 1–4 to 3–2. As will be seen in the subsequent examples, the "throwing power", i.e., the ability of the activator to deposit material on internal surfaces, is substantially increased when either the mixture or the complex aluminum halide is used as opposed to using either the aluminum halide or the alkali or alkaline earth halide alone.

The coating procedure, according to this invention, can be carried out at any of the conventional temperatures, preferably 1800° F.–2200° F.

EXAMPLE 1

In order to demonstrate the "throwing power" of systems of this invention, a test chamber approximately 4" long by 4" wide by 5" high was provided within which two tubes 2" × ¼" I.D. of AMS 5582 were suspended; one in a horizontal position and one in a vertical position. The base of the chamber was filled with a powder mixture having a source of aluminum, either aluminum powder or a cobalt-aluminum powder, the activator to be evaluated, with the balance being powdered aluminum oxide. The tests herein were conducted at 2000° F. for periods of time from 4–10 hours. The results of these tests are set forth in Table 1.

TABLE I

| Sample # | Source of Al (Wt. %) | Activator (Wt. %) | Internal Coating Thickness (mls) V = Vertical Tube H = Horizontal Tube | | |
|---|---|---|---|---|---|
| | | | End | 1/2" | Center |
| 1 | Aluminum - 10% | $NH_4Cl$ 5% | (V) 1.7 | 1.0 | 0 |
| | | | (H) 1.7 | 0 | 0 |
| 2 | Aluminum - 10% | NaCl 5% | (V) 1.3 | 0.8 | 0 |
| | | | (H) 1.4 | 0.4 | 0 |
| 3 | Aluminum - 10% | $Na_3AlF_6$ 5% | (V) 3.3 | 1.9 | 1.7 |
| | | | (H) 2.0 | 1.7 | 1.7 |
| 4 | $Co_2Al_5$ - 10% | $Na_3AlF_6$ 5% | (V) 2.9 | 2.5 | 2.2 |
| | | | (H) 2.7. | 1.8 | |
| | | | 2.5 | | |

As can be seen, the conventional halide activator was unable to coat the inside of the tubes other than at the end, whereas an activator of this invention coated the entire inside length of the tube.

EXAMPLE 2

In order to demonstrate the use of the process in the manner of Example 1, a complex air cooled, first stage turbine blade of MAR-M-200 in the directionally solidified form (9.0 Cr, 10.0 Co, 2.0 Ti, 5.0 Al, 0.15 C, 12.5 W, 1.0 Cb, 0.015 B, 0.05 Zr, bal. Ni) was coated using the pack powder composition of Sample 4 in Table 1. The blade was suspended in a horizontal position above the pack powder and thermally cycled at 2000° F. for a period of seven (7) hours. The results are set forth in Table 2. Variations in coating thickness are a result of part geometry.

TABLE 2

| Airfoil Section | Internal Coating Thickness (mils) |
|---|---|
| 90% Span | 1.0 – 2.0 |
| 50% Span | 0.9 – 1.8 |
| 10% Span | 0.7 – 2.0 |

EXAMPLE 3

Improved use of the process to coat internal passages of gas turbine blades was accomplished by mounting the blades in a suitably sealed chamber on a hollow tube manifolded to a chamber containing the powder mixture and means for introducing a carrier gas such as argon or hydrogen into the space above the powder and below the manifold. By this arrangement, internal coating of the part could be accomplished using one powder composition while another powder composition located in the upper chamber could be used to coat the external surface of the blade. The actual thickness of the coating of the internal surface of the blade varied somewhat due to the internal geometry of the part. The coating measurements obtained for various activators and parts are set forth in Table 3.

TABLE 3

| Blade | Source of Al Wt. % | Actuator & Carrier Gas | Internal Coating Thickness (Mils) | Temp. °F | Time Hours |
|---|---|---|---|---|---|
| First Stage Turbine Blade | $CO_2Al_5$ 10% | $AlCl_3$ 5% Hydrogen | 0 – 0.8 | 2000 | 5 |
| First Stage Turbine Blade | $CO_2Al_5$ 10% | NaCl 5% Hydrogen | 0.9 – 2.3 | 2000 | 5 |
| First Stage Turbine Blade | $CO_2Al_5$ 10% | NaCl 2.5% $AlCl_3$ 2.5% Hydrogen | 1.6 – 2.5 | 2000 | 5 |
| First Stage Turbine Blade | $CO_2Al_5$ 10% | NaCl 2.5% $AlCl_3$ 2.5% Argon | 1.9 – 2.5 | 2000 | 5 |
| First Stage Turbine Blade | $CO_2Al_5$ 10% | NaCl 2.5% $AlCl_3$ 2.5% Argon | 1.6 – 2.5 | 2000 | 3 |
| Second Stage Turbine Blade | $CO_2Al_5$ 10% | NaCl 2.5% $AlCl_3$ 2.5% Argon | 2.1 – 2.5 | 2000 | 3 |

As can be seen from the above examples, the use of the activators of this invention substantially increase the "throwing power" of a powder mixture for the gas phase aluminizing of internal passages in metal substrates. The activators of this invention are shown to produce thicker and more uniform aluminum deposits than the aluminum halide, alkali metal halide, or ammonium halide activators of the prior art.

While this invention has been described with respect to specific examples thereof, it should not be construed as limited thereto. Various modifications made by workers skilled-in-the-art without departing from the scope of this invention, which is limited only by the following claims, wherein:

We claim:

1. A gas diffusion process for providing an aluminum coating on internal passages in a metal substrate selected from a group consisting of iron, chromium, cobalt, and nickel-base alloys which comprises:
   (a) Heating a powder mixture comprising a source of aluminum, a carrier material selected from the group consisting of complex aluminum halides of alkaline earth metals and mixtures of aluminum halide with a material selected from the group consisting of alkaline earth halides and alkali metal halides, and an inert filler to a temperature sufficient to cause evolution of aluminum-containing gases; and
   (b) Passing said gases through internal passages of said substrate while said substrate is maintained out of contact with said powder mixture and at a temperature sufficient to produce aluminum diffusion onto the internal surfaces of said part.

2. The method of claim 1 wherein said aluminum containing gases are admixed with an inert gas stream and driven through said internal passages.

3. The method of claim 1 wherein said carrier consists of a sodium aluminum halide.

4. The method of claim 3 wherein said carrier is present in from 1–50% by weight of said powder mixture.

5. The method of claim 4 wherein said halide is the fluoride.

6. The method of claim 1 wherein said carrier consists of a mixture of sodium halide and aluminum halide in a weight ratio ranging from ¼–3/2.

7. The method of claim 6 wherein said mixture of sodium halide and aluminum halide is present in from 1–50% by weight of said powder mixture.

8. The method of claim 7 wherein the halide is a chloride.

* * * * *